United States Patent [19]

Maeda

[11] Patent Number: 5,696,453

[45] Date of Patent: Dec. 9, 1997

[54] GAAS LOGIC CIRCUIT WITH TEMPERATURE COMPENSATION CIRCUITRY

[75] Inventor: Tadashi Maeda, Tokyo, Japan

[73] Assignee: NEC Corporation, Tokyo, Japan

[21] Appl. No.: 560,570

[22] Filed: Nov. 20, 1995

[30] Foreign Application Priority Data

Dec. 21, 1994 [JP] Japan .................. 6-318810

[51] Int. Cl.$^6$ ........................... H03K 19/0952
[52] U.S. Cl. ............................ 326/32; 326/117
[58] Field of Search .................. 326/32, 33, 34, 326/116, 117, 120

[56] References Cited

U.S. PATENT DOCUMENTS 4,789,798  12/1988  Lach ............................ 326/32
5,077,494  12/1991  Bowers et al. ................. 326/32

FOREIGN PATENT DOCUMENTS 57-72429  5/1982  Japan .
2-228815  9/1990  Japan ........................ 326/117
6-204853  7/1994  Japan ........................ 326/117

Primary Examiner—Edward P. Westin
Assistant Examiner—Benjamin D. Driscoll
Attorney, Agent, or Firm—Sughrue, Mion, Zinn, Macpeak & Seas, PLLC

[57] ABSTRACT

The invention provides a logic circuit including (a) a load element having ends one of which is electrically connected to a first terminal of a voltage source, and the other to an output terminal, (b) a first enhancement mode FET including a drain electrode electrically connected to the output terminal, a gate electrode connected to an input terminal, and a source electrode connected to a junction, (c) a second enhancement mode FET including a drain electrode electrically connected to the first terminal, a gate electrode connected to the output terminal, and a source electrode connected to the junction, and (d) a depletion mode FET including a drain electrode electrically connected to the junction, a gate electrode connected to a control terminal, and a source electrode connected to a second terminal of the voltage source. The logic circuit ensures sufficient noise margin to temperature variation, resulting in a lower supply voltage. In addition, the logic circuit makes it possible to compensate for a variation in logical threshold value of DC transfer characteristic caused by an increase in temperature.

12 Claims, 4 Drawing Sheets

GAAS LOGIC CIRCUIT WITH TEMPERATURE COMPENSATION CIRCUITRY

BACKGROUND OF THE INVENTION

1. Field of the Invention

The invention relates to a logic circuit, and more particularly to a logic circuit having a characteristic for compensating for temperature variation.

2. Description of the Related Art

It is known that GaAs semiconductor decreases parasitic capacitance of an integrated circuit and ensures high-speed logic operation, since GaAs semiconductor has an electron mobility several times greater than that of silicon, and it is relatively easy to fabricate a semi-insulative substrate therefrom. Thus, a GaAs semiconductor has been actively researched and developed.

Among several basic circuits of GaAs semiconductor, a direct coupled FET logic (hereinafter, referred to simply as "DCFL") including an enhancement mode field effect transistor (FET) is superior to others because a DCFL circuit has a simple structure suitable for large integration, and does not need a high supply voltage. Thus, there has been commercially available a gate array having a DCFL circuit as a basic circuit, and also having 100K gate scale integration.

As illustrated in FIG. 1, a conventional GaAs DCFL circuit comprises a depletion mode FET 50 and an enhancement mode FET 51. The depletion mode FET 50 has a drain electrode electrically connected to a first terminal 100 of a voltage source, and gate and source electrodes to an output terminal 11. The enhancement mode FET (hereinafter, referred to as EFET) 51 has a drain electrode electrically connected to the output terminal 11, a gate electrode connected to an input terminal 10, and a source electrode connected to a second terminal 101 of the voltage source. When a voltage which is sufficiently high relative to the gate electrode is applied to the GaAs DCFL circuit through the input terminal 10, a current runs through the EFET 51, and thus the potential at the output terminal 11 is lowered. On the other hand, when a voltage which is low relative to the gate electrode is applied to the GaAs DCFL circuit through the input terminal 10, a current does not run through the EFET 51, and thus the potential at the output terminal 11 remains high.

In the DCFL circuit illustrated in FIG. 1, the first terminal 100 is grounded, and the second terminal is connected to $-2.0$ V source in order to ensure the compatibility with a silicon bipolar emitter coupled FET logic (Si bipolar ECL) circuit. In the illustrated DCFL circuit, the potential at the output terminal 11 cannot be raised above the schottky barrier of GaAs FET or MES FET of a next stage, and hence a theoretical amplitude is limited into a certain range. Accordingly, even if a supply voltage is set high, it would be impossible to increase the theoretical amplitude. This brings a problem that the margin for noises remains small.

In the DCFL circuit, a current runs through the schottky diode of the next stage EFET when the output is high. The produced current does not contribute to driving the load or the EFET 51, and hence the current is consumed in vain, but the power consumption of the DCFL circuit is increased. In order to reduce the power consumption of the DCFL circuit, it is most effective to lower the supply voltage. In addition, it is possible to reduce wasteful current by setting a supply voltage below the schottky barrier of MES FET or GaAs FET. However, it has been considered that there is no advantage in providing a voltage source to be used only for GaAs FET. These days, as high speed operation of LSI has been accomplished in order to increase processing speed of an engineering work station (EWS) and a super high speed computer, it becomes necessary now to prevent temperature raise of the DCFL circuit caused by heat build-up of chips. As a result, the restriction about a supply voltage, which has conventionally been demanded, may be loosened.

As mentioned earlier, the DCFL circuit has a defect that it is difficult to ensure the noise margin against the temperature variation. In addition, when a supply voltage is to be set below the schottky barrier of MES FET, the theoretical amplitude is further lowered. Thus, in order to ensure the noise margin, the temperature range in which LSI is to be operated had to be narrowed.

Hereinbelow will be calculated the noise margin against threshold value variation caused by temperature variation. Provided that a threshold voltage of MES FET is denoted by Vt, a gate width by W, and a mutual conductance parameter by K, a drain current Ids is approximately calculated as follows.

$$Ids = WK[2(Vgs-Vt)Vds-Vds^2] \quad (Vgs-Vt>Vds)$$

$$Ids = WK(Vgs-Vt)^2 \quad (Vgs-Vt<Vds)$$

The theoretical threshold value (Vthc) of the DCFL inverter is denoted by the following equation, based on the fact that a current running through the enhancement mode MES FET is equal to a current running through the depletion mode MES FET.

$$Vthc = Vt_E + (W_D K_D / W_E K_E)^{1/2} |Vt_D|$$

In the above equation, subscripts represent each of FETs. The theoretical threshold value Vthc is directly affected by the threshold variation of the EFET caused by temperature variation. The threshold voltage variation of a conventional EFET caused by temperature variation is about 1.0 mV. Hence, for instance, provided that the temperature range in which LSI is to be operated is set to be 200 degrees, the temperature margin of about 200 mV is required. In the DCFL circuit, since the theoretical amplitude is proportional to a supply voltage, the variation in the threshold voltage makes it impossible to reduce a supply voltage.

For instance, Japanese Unexamined Patent Public Disclosure No. 57-72429 has suggested a semiconductor integrated circuit. This circuit comprises a voltage supply for supplying a voltage dependent on temperature, and an insulative gate FET disposed between a junction at which a supply voltage is applied to the circuit and a point in the circuit, and driven by the voltage supplied by the voltage supply. In this circuit a current which is to run through the insulative gate FET is controlled dependent on temperature. Thus, it is set forth in the Disclosure that the semiconductor integrated circuit can compensate for the reduction of a current caused by temperature raise, and thus maintain the response time and the consumption of current to be almost constant independently of the temperature.

SUMMARY OF THE INVENTION

It is an object of the present invention to provide a logic circuit which ensures sufficient temperature margin for a DCFL circuit and a push-pull circuit, and reduces power consumption without the reduction of noise margin even if a supply voltage is determined to be below the schottky barrier of MES FET.

The invention provides a logic circuit including (a) a load element having ends one of which is electrically connected to a first terminal of a voltage source, and the other to an output terminal, (b) a first enhancement mode FET including a drain electrode electrically connected to the output terminal, a gate electrode connected to an input terminal, and a source electrode connected to a junction, (c) a second enhancement mode FET including a drain electrode electrically connected to the first terminal, a gate electrode connected to the output terminal, and a source electrode connected to the junction, and (d) a depletion mode FET including a drain electrode electrically connected to the junction, a gate electrode connected to a control terminal, and a source electrode connected to a second terminal of the voltage source.

The invention further provides a logic circuit including (a) a load element having ends one of which is electrically connected to a first terminal of a voltage source, and the other to an output terminal, (b) a plurality of first enhancement mode FETs in each of which a drain electrode thereof is electrically connected to the output terminal, a gate electrode thereof to an input terminal, and a source electrode thereof to a junction, (c) a second enhancement mode FET included a drain electrode electrically connected to the first terminal, a gate electrode connected to the output terminal, and a source electrode connected to the junction, and (d) a depletion mode FET including a drain electrode electrically connected to the junction, a gate electrode connected to a control terminal, and a source electrode connected to a second terminal of the voltage source.

The above mentioned logic circuit may further include an amplifier having input and output ports, the output terminal being connected to the input port of the amplifier, and the control terminal being connected to the output port of the amplifier.

The invention still further provides a logic circuit including (a) a load element having ends one of which is electrically connected to a first terminal of a voltage source, (b) a first enhancement mode FET including a drain electrode, a gate electrode connected to an input terminal, a gate electrode, and a source electrode connected to a junction, (c) a second enhancement mode FET including a drain electrode electrically connected to the first terminal, a gate electrode, and a source electrode connected to the junction, (d) a depletion mode FET including a drain electrode electrically connected to the junction, a gate electrode, and a source electrode connected to a second terminal of the voltage source, and (e) an amplifier having input and output ports, the other end of the load element, the drain and gate electrodes of the first enhancement mode FET, and the gate electrode of the second enhancement mode FET being electrically connected to the input port of the amplifier, and the gate electrode of the depletion mode FET being electrically connected to the output port of the amplifier.

For instance, the load element is made up of a resistor or a depletion mode FET including a drain electrode electrically connected to the first terminal, a gate electrode connected to the output terminal, and a source electrode connected to the output terminal.

In the logic circuit in accordance with the invention, outputs of a source follower circuit which receives outputs of the DCFL circuit as inputs are arranged to be fed-back to a source electrode of the driver enhancement mode FET of the DCFL circuit. Thus, when an input voltage is at a low level, the driver EFET turns off, and hence an output voltage can be increased up to a supply voltage. A supply voltage of the driver EFET of the DCFL circuit is also increased together with the output voltage. When the input voltage is on a high level, the driver enhancement mode FET turns on, and hence the output voltage is lowered. However, since the EFET of the source follower circuit also turns off, the supply voltage of the DCFL circuit is also lowered. By controlling a gate voltage of a load FET in the source follower circuit, it is possible to vary the supply voltage of the driver EFET in the DCFL circuit when the input voltage is on a low level, and thus compensate for the variation in DC transfer characteristic caused by temperature raise.

In the logic circuit in accordance with the invention, the voltage of the source electrode of the driver EFET in the DCFL circuit is controlled by feeding-back the outputs of the source follower circuit to the driver EFET, where the source follower circuit is connected in parallel to the driver EFET. Thus, it is possible to compensate for the variation in the theoretical threshold value of DC transfer characteristic caused by an increase in temperature.

In addition, by using the logic circuit in accordance with the invention is basic elements in a DCFL circuit, sufficient noise margin for the circuit can be obtained against the temperature variation, resulting in that it is possible to lower a supply voltage. Specifically, it is possible to lower the voltage down to about one-tenth with power consumption and operation rate of LSI being maintained as they are. Thus, it is expected that the logic circuit in accordance with the invention ensures remarkable improvement in performance of EWS and a super computer in the future.

Furthermore, the logic circuit makes it possible to compensate for manufacturing variation in threshold value with the result of higher production yield.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 1:
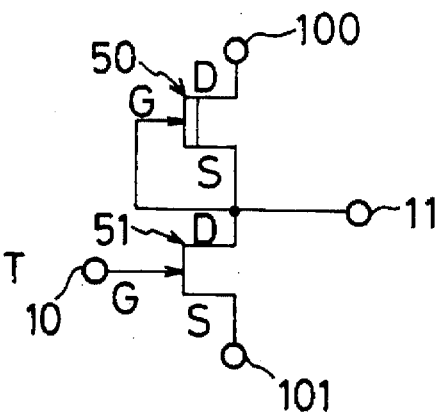
FIG. 1 is a circuit diagram of a conventional logic circuit.
Figure 2:
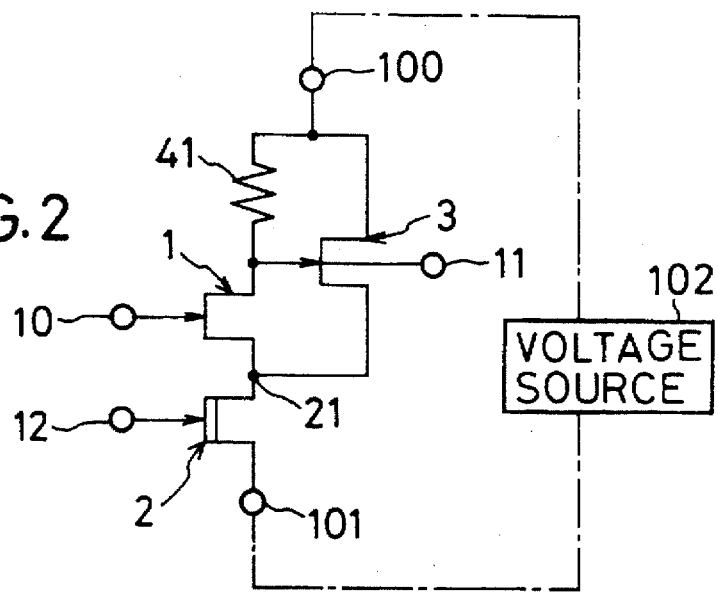
FIG. 2 is a circuit diagram of the logic circuit in accordance with the first embodiment of the present invention.

FIG. 2 illustrates the logic circuit in accordance with the first embodiment. The illustrated logic circuit comprises a resistor 41 as a load element, a first enhancement mode FET 1, a second enhancement mode FET 3, and a depletion mode FET 2. The resistor 41 has ends one of which is electrically connected to a first terminal 100 of a voltage source 102, and the other of which is connected to an output terminal 11 of a DCFL circuit. The first EFET 1 includes a drain electrode electrically connected to the output terminal 11, a gate electrode electrically connected to an input terminal 10 of the DCFL circuit, and a source electrode connected to a junction 21. The second EFET 3 includes a drain electrode electrically connected to the first terminal 100, a gate electrode electrically connected to the output terminal 11, and a source electrode connected to the junction 21. The depletion mode FET 2 includes a drain electrode electrically connected to the junction 21, a gate electrode connected to a control terminal 12, and a source electrode connected to a second terminal 101 of the voltage source 102.

In operation, when an input voltage is at a low level, the driver EFET 1 is maintained off, and thus an output voltage is increased to the supply voltage. On the other hand, since the EFET 3 cooperates with the depletion mode FET 2 to constitute a source follower circuit, the voltage at the junction 21 is maintained high in accordance with the output voltage. When the input voltage is at a high level, the driver EFET 1 is maintained on, and hence the output voltage is lowered. However, the EFET 3 in the source follower circuit also turns off, and hence the voltage at the junction 21 is also lowered. At this time, by setting the gate voltage of the depletion mode FET 2 to be high, it is possible to lower the voltage at the junction 21 even when the input voltage is at a low level. To the contrary, by setting the gate voltage of the depletion mode FET 2 to be low, it is possible to increase the voltage at the junction 21.

When ambient temperature is relatively low, a voltage higher than the supply voltage of the depletion mode FET 2 is applied to the FET 2 through the control terminal 12. On the other hand, when ambient temperature is relatively high, a voltage lower than the supply voltage of the depletion mode FET 2 is applied to the FET 2.

Hereinbelow is explained the operation of the DCFL circuit in each of the ambient temperatures. When the ambient temperature is relatively low, the threshold voltage of the FET 1 is shifted to a positive side. At this time, by applying a voltage gradually increasing relative to the source voltage to the input terminal 10, the input voltage at which a current begins running through the FET 1 becomes higher than the input voltage at which a current begins running through the FET 1 at room temperature. In such a case, it is possible to compensate for the variation in DC transfer characteristic caused by temperature range by setting the voltage at the junction 21 to be obtained when the input voltage is at a low level.

When the ambient temperature is relatively high, the threshold voltage of the FET 1 is shifted to a negative side. Thus, a current which runs through the FET 1 begins running at a lower voltage than a voltage where a current is running at room temperature. It is possible to prevent the theoretical threshold voltage from being shifted to a negative side by setting the voltage of the control terminal 12 of the depletion mode FET 2 to be lower than the voltage to occur at room temperature, and hence making a current for compensation to run through the depletion mode FET 2 to be small. As having been described, the theoretical threshold voltage of the DCFL circuit can be controlled by varying the gate voltage of the depletion mode FET 2 with the ambient temperature.

Figure 3:
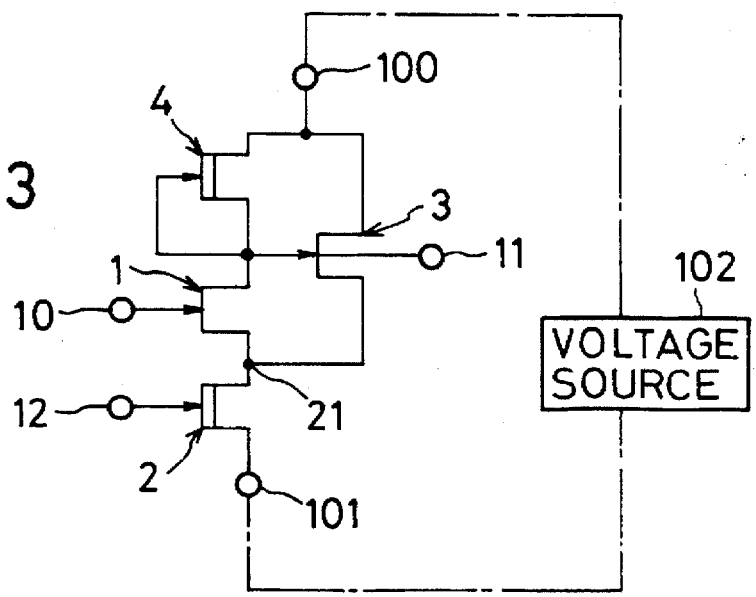
FIG. 3 is a circuit diagram of the logic circuit in accordance with the second embodiment of the present invention.

FIG. 3 illustrates the logic circuit in accordance with the second embodiment of the present invention. In the illustrated logic circuit, a depletion mode FET 4 is substituted for the resistor 41 used in the first embodiment. The depletion mode FET 4 includes a drain electrode electrically connected to the first terminal 100, a gate electrode connected to the output terminal 11, and a source electrode connected to the output terminal 11. The logic circuit in accordance with the second embodiment has the same structure as that of the first embodiment except a difference between the resistor 41 and the depletion mode FET 4. Thus, the logic circuit illustrated in FIG. 3 has the same advantages as those of the logic circuit illustrated in FIG. 2.

Figure 4:
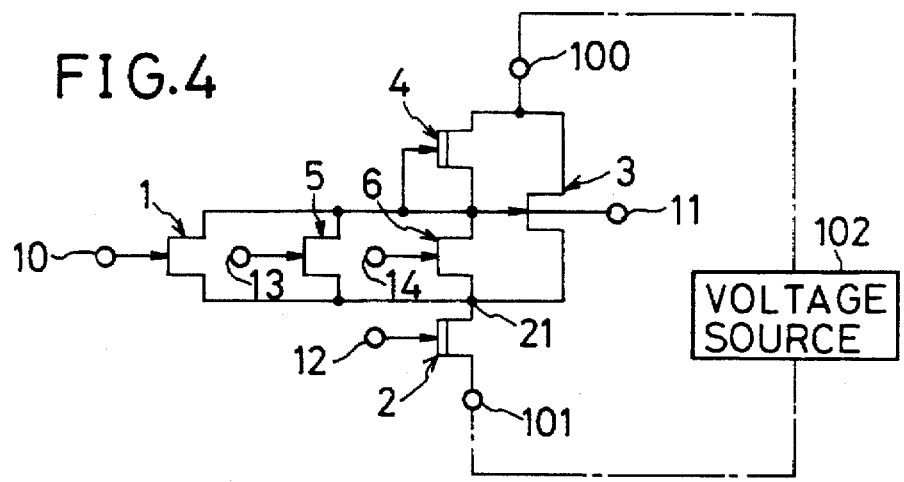
FIG. 4 is a circuit diagram of the logic circuit in accordance with the third embodiment of the present invention.

FIG. 4 illustrates the logic circuit in accordance with the third embodiment of the present invention. The illustrated logic circuit comprises a first depletion mode FET 4 as a load element, a plurality of first enhancement mode FETs 1, 5 and 6, a second enhancement mode FET 3, and a second depletion mode FET 2. The first depletion mode FET 4 is the same in structure as that of the logic circuit illustrated in FIG. 3, and accordingly has ends one of which is electrically connected to the first terminal 100 of the voltage source 102, and the other of which is connected to the output terminal 11 of the DCFL circuit. Each of the first EFETs 1, 5 and 6 includes a drain electrode electrically connected to the output terminal 11, a gate electrode electrically connected to each of input terminals 14, 13 and 10 of the DCFL circuit, and a source electrode connected to the junction 21. The second EFET 3 is the same in structure as that of the logic circuit illustrated in FIG. 3, and accordingly includes a drain electrode electrically connected to the first terminal 100, a gate electrode electrically connected to the output terminal 11, and a source electrode connected to the junction 21. The second depletion mode FET 2 is also the same in structure as that of the logic circuit illustrated in FIG. 3, and accordingly includes a drain electrode electrically connected to the junction 21, a gate electrode connected to a control terminal 12, and a source electrode connected to the second terminal 101 of the voltage source 102.

The logic circuit illustrated in FIG. 4 constitutes a NOR circuit. The driver EFETs 14, 13 and 10 are connected in parallel in the DCFL circuit in order to increase the fan-in number.

The number of the driver EFETs is not limited to three. There may be provided two or four or more driver EFETs in the DCFL circuit.

In addition, in place of the first depletion mode FET 4 may be provided the resistor 41 as a load element as one illustrated in FIG. 2.

Figure 5:
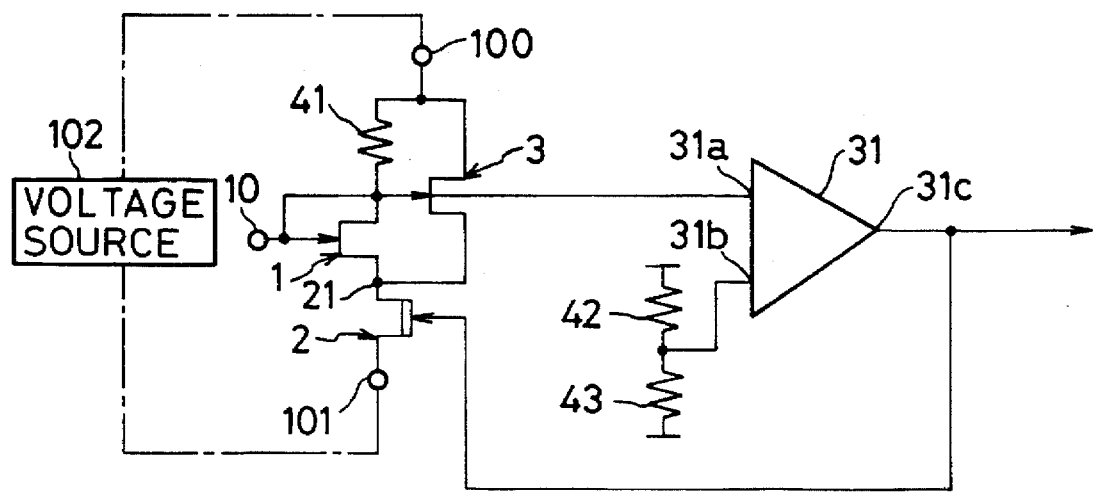
FIG. 5 is a circuit diagram of the logic circuit in accordance with the fourth embodiment of the present invention.

FIG. 5 illustrates the logic circuit in accordance with the fourth embodiment. The illustrated logic circuit comprises a resistor 41 as a load element, a first enhancement mode FET 1, a second enhancement mode FET 3, a depletion mode FET 2, and an OP amplifier 31. The resistor 41 has ends one of which is electrically connected to a first terminal 100 of a voltage source 102, and the other to an input port 31a of the OP amplifier 31. The first enhancement mode FET 1 includes a drain electrode electrically connected to the input port 31a of the OP amplifier 31, a gate electrode connected both to an input terminal 10 and to the input port 31a of the OP amplifier 31, and a source electrode connected to a junction 21. The second enhancement mode FET 3 includes a drain electrode electrically connected to the first terminal 100, a gate electrode connected to the input port 31a of the OP amplifier 31 together with the gate electrode of the first enhancement mode FET 1, and a source electrode connected to the junction 21. The depletion mode FET 2 includes a drain electrode electrically connected to the junction 21, a gate electrode connected to an output port 31c of the OP amplifier 31, and a source electrode connected to a second terminal 101 of the voltage source 102.

The OP amplifier 31 has two input ports 31a and 31b, and an output port 31c. As mentioned above, to the input port 31a are connected the resistor and the gate electrodes of the first and second enhancement mode FETs 1 and 3. To the input port 31b are connected the resistors 42 and 43. To the output port 31c is connected the gate electrode of the depletion mode FET 2. The OP amplifier 31 shorts the input terminal 10 to an output terminal of the DCFL circuit to thereby generate an amplified output through the output port 31c. The thus amplified output is fed-back to the gate electrode of the depletion mode FET 2 to control the DCFL circuit.

Figure 6:
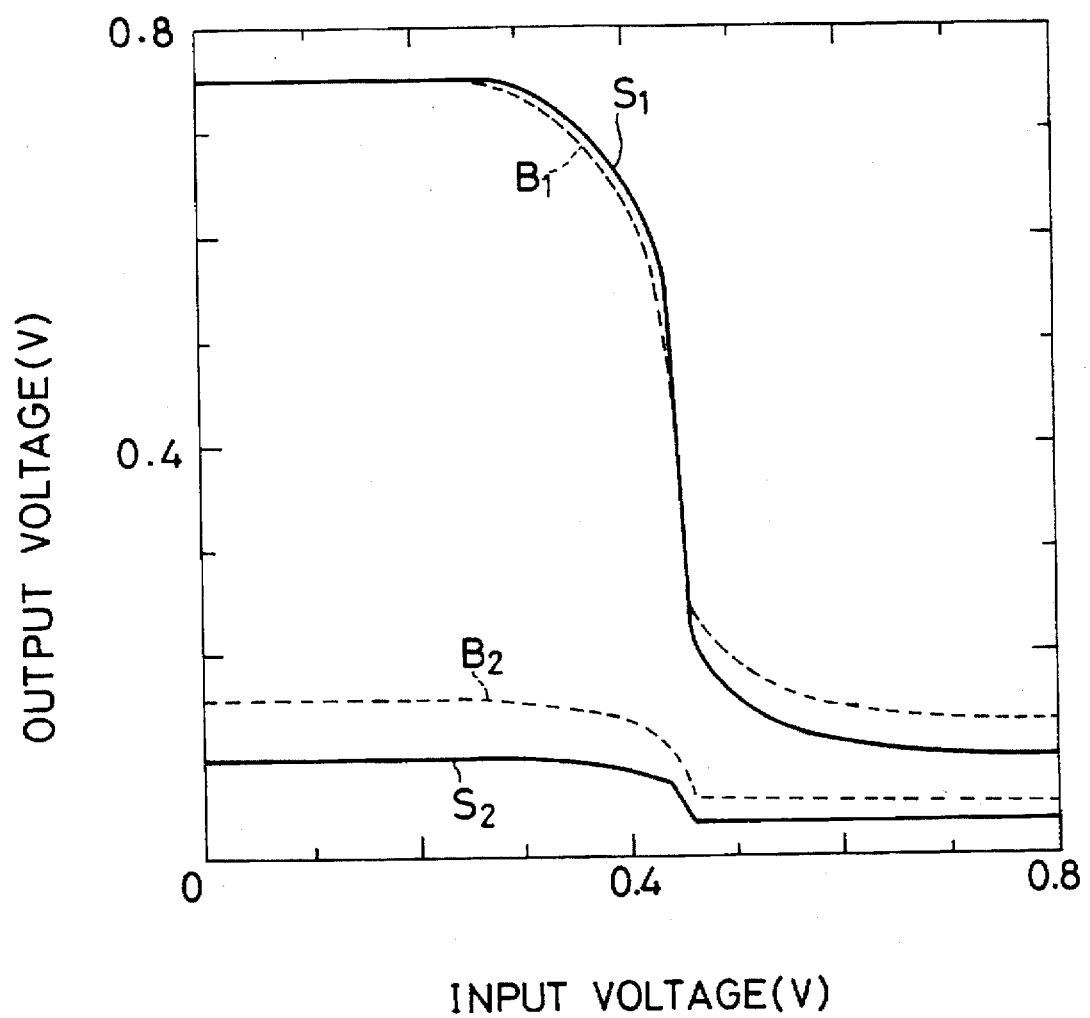
FIG. 6 is a graph showing the simulated DC transfer characteristic of the logic circuit in accordance with the invention.

FIG. 6 shows the simulated input/output transfer characteristic of the logic circuit in accordance with the invention. A solid line $S_1$ shows the transfer characteristic at room temperature, while a broken line $B_1$ shows the transfer characteristic at high temperature. In the graph, the voltage at the junction 21 is also shown. Namely, a solid line $S_2$ shows the voltage at room temperature, and a broken line $B_2$ shows the voltage at high temperature. It is understood that the voltage occurring when an input voltage is at a low level is controlled to be high at high temperature, and to be low at room temperature by varying the gate voltage of the depletion mode FET 2 with ambient temperature.

Figure 7:
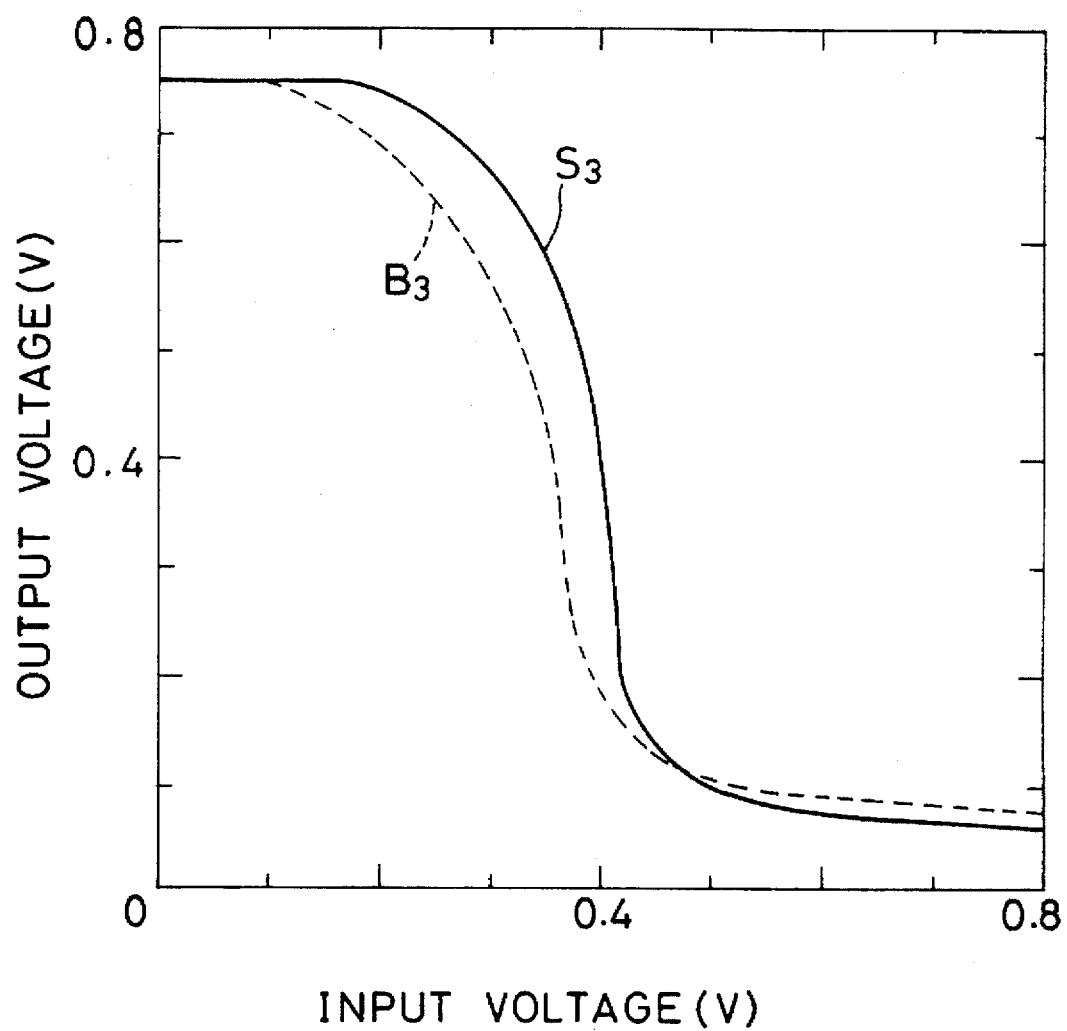
FIG. 7 is a graph showing the simulated DC transfer characteristic of a conventional logic circuit.

FIG. 7 shows the simulated input/output transfer characteristic of a conventional DCFL circuit. A solid line S3 shows the transfer characteristic at room temperature, and a broken line B3 shows the transfer characteristic at high temperature. It is understood that the theoretical threshold voltage is shifted to a negative side with temperature raise.

The above mentioned embodiments are applied to the DCFL circuit, however, it should be noted that the embodiments may be applied to a push-pull circuit.

It should be noted that the logic circuit in accordance with the third embodiment illustrated in FIG. 4 may include the OP amplifier 31 which is an element of the fourth embodiment illustrated in FIG. 5. If the logic circuit illustrated in FIG. 4 includes the OP amplifier 31, the output terminal 11 is arranged to be connected to the input port 31a of the OP amplifier 31, and the control terminal 12 is arranged to be connected to the output port 31c of the OP amplifier 31.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A logic circuit comprising:
   a load element having ends one of which is electrically connected to a first terminal of a voltage source, and the other to an output terminal;
   a first enhancement mode FET including a drain electrode electrically connected to said output terminal, a gate electrode connected to an input terminal, and a source electrode connected to a junction;
   a second enhancement mode FET including a drain electrode electrically connected to said first terminal, a gate electrode connected to said output terminal, and a source electrode connected to said junction; and
   a depletion mode FET including a drain electrode electrically connected to said junction, a gate electrode connected to a control terminal, and a source electrode connected to a second terminal of said voltage source.

2. The logic circuit as set forth in claim 1, wherein said load element comprises a resistor.

3. The logic circuit as set forth in claim 1, wherein said load element comprises a depletion mode FET including a drain electrode electrically connected to said first terminal, a gate electrode connected to said output terminal, and a source electrode connected to said output terminal.

4. A logic circuit comprising:
   a load element having ends one of which is electrically connected to a first terminal of a voltage source, and the other to an output terminal;
   a plurality of first enhancement mode FETs in each of which a drain electrode thereof is electrically connected to said output terminal, a gate electrode thereof to an input terminal, and a source electrode thereof to a junction;
   a second enhancement mode FET included a drain electrode electrically connected to said first terminal a gate electrode connected to said output terminal, and a source electrode connected to said junction; and
   a depletion mode FET including a drain electrode electrically connected to said junction, a gate electrode connected to a control terminal, and a source electrode connected to a second terminal of said voltage source.

5. The logic circuit as set forth in claim 4 further comprising an amplifier having input and output ports, said output terminal being connected to said input port of said amplifier, and said control terminal being connected to said output port of said amplifier.

6. The logic circuit as set forth in claim 4, wherein said load element comprises a resistor.

7. The logic circuit as set forth in claim 4, wherein said load element comprises a depletion mode FET including a drain electrode electrically connected to said first terminal, a gate electrode connected to said output terminal, and a source electrode connected to said output terminal.

8. The logic circuit as set forth in claim 5, wherein said load element comprises a resistor.

9. The logic circuit as set forth in claim 5, wherein said load element comprises a depletion mode FET including a drain electrode electrically connected to said first terminal, a gate electrode connected to said output terminal, and a source electrode connected to said output terminal.

10. A logic circuit comprising:
    a load element having ends one of which is electrically connected to a first terminal of a voltage source;
    a first enhancement mode FET including a drain electrode, a gate electrode connected to an input terminal, and a source electrode connected to a junction;
    a second enhancement mode FET including a drain electrode electrically connected to said first terminal, a gate electrode, and a source electrode connected to said junction;
    a depletion mode FET including a drain electrode electrically connected to said junction, a gate electrode, and a source electrode connected to a second terminal of said voltage source; and
    an amplifier having input and output ports, the other end of said load element, said drain and gate electrodes of said first enhancement mode FET, and said gate electrode of said second enhancement mode FET being electrically connected to said input port of said amplifier, and said gate electrode of said depletion mode FET being electrically connected to said output port of said amplifier.

11. The logic circuit as set forth in claim 10, wherein said load element comprises a resistor.

12. The logic circuit as set forth in claim 10, wherein said load element comprises a depletion mode FET including a drain electrode electrically connected to said first terminal, and gate and source electrodes both connected to said input port of said amplifier.

* * * * *

UNITED STATES PATENT AND TRADEMARK OFFICE
CERTIFICATE OF CORRECTION

PATENT NO. : 5,696,453
DATED : December 9, 1997
INVENTOR(S) : Tadashi MAEDA

It is certified that error appears in the above-identified patent and that said Letters Patent is hereby corrected as shown below:

Column 6, line 62, "OF" should read --OP--.

Col. 6, line 63, after "resistor" insert --41--.

Signed and Sealed this

Ninth Day of June, 1998

Attest:

BRUCE LEHMAN

Attesting Officer      Commissioner of Patents and Trademarks